United States Patent
Asamoto

(10) Patent No.: US 6,478,876 B1
(45) Date of Patent: Nov. 12, 2002

(54) APPARATUS FOR COATING A BODY BY USING ION PLATING

(76) Inventor: Masaji Asamoto, 41-80, 4-gaiku, 3-bancho, Kikyogaoka, Nabari-shi, Mie 518-0623 (JP)

(*) Notice: Subject to any disclaimer, the term of this patent is extended or adjusted under 35 U.S.C. 154(b) by 0 days.

(21) Appl. No.: 09/577,128

(22) Filed: May 24, 2000

(30) Foreign Application Priority Data

May 26, 1999 (JP) .......................... 11-146154

(51) Int. Cl.[7] ..................... C23C 16/00; H05H 1/02
(52) U.S. Cl. ................. 118/726; 118/723 VE; 118/718; 118/729; 427/434.2; 427/566
(58) Field of Search ................. 118/726, 723 VE, 118/718, 724, 729, 723 CB, 723 EB, 723 FE, 723 FI; 427/592, 585, 580, 584, 434.2, 566; 204/298.01, 298.02, 298.05, 298.36

(56) References Cited

U.S. PATENT DOCUMENTS

| | | | | |
|---|---|---|---|---|
| 4,220,117 A | * | 9/1980 | Shinohara | ............ 118/718 |
| 5,013,416 A | * | 5/1991 | Murayama et al. | ...... 204/192.1 |
| 5,609,919 A | * | 3/1997 | Yuan et al. | ............ 427/421 |
| 5,952,061 A | * | 9/1999 | Yoshida et al. | ............ 427/580 |

FOREIGN PATENT DOCUMENTS

| | | | | |
|---|---|---|---|---|
| JP | 61-279668 A | * | 12/1986 | ............ C23C/14/32 |
| JP | 62-108517 A | * | 5/1987 | ......... H01L/21/203 |
| JP | 3-287761 A | * | 12/1991 | ............ C23C/14/32 |
| JP | 4-37690 A | * | 2/1992 | ............ C30B/23/08 |
| JP | 7-157868 A | * | 6/1995 | ............ C23C/14/32 |
| JP | 9-20587 A | * | 1/1997 | ............ C30B/23/08 |
| JP | 2001-11607 A | * | 1/2001 | ............ C23C/14/32 |

* cited by examiner

Primary Examiner—Marian C. Knode
Assistant Examiner—P. Hassanzadeh
(74) Attorney, Agent, or Firm—Rabin & Berdo, P.C.

(57) ABSTRACT

There is provided a making method of a coated body by using ion plating. A melt and evaporating source housed in an evaporation container disposed above a subject to be coated in a vacuum container, is heated. The melt and evaporating source is evaporated through a number of fine evaporation holes formed in an evaporation face formed by the bottom of the evaporation container, yet preventing the melt and evaporating source from dropping. The evaporated particles from the melt and evaporating source are ionized with the use of plasma generated between the evaporation container and the subject to be coated. From above, the surface of the subject to be coated is coated with the ionized evaporated-particles, causing the ionized evaporated-particles to adhere to the surface of the subject to be coated, thus forming a coating film thereon.

18 Claims, 3 Drawing Sheets

APPARATUS FOR COATING A BODY BY USING ION PLATING

CROSS REFERENCE TO RELATED APPLICATION

This application claims priority benefits under 35 USC §119 of Japanese Patent Application Serial No. 11-146154, filed on May 26, 1999, the disclosure of which is incorporated herein by reference.

BACKGROUND OF THE INVENTION

1. Field of the Invention

The present invention relates to method of and apparatus for producing a coated body by using ion plating, in each of which coating material particles ionized in a vacuum container coat and adhere to the surfaces of a body to be coated.

2. Description of Related Art

As examples of a method of coating a substrate surface with metal or other substance, there are known a vacuum evaporation method, an ion plating method, a sputtering method, a plasma method and the like, in each of which a coating substance is gasified or ionized in a vacuum, causing the substance thus ionized to come into collision with the substrate surface.

These methods are used for coating a variety of accessories and electronic parts and are applied even for particle bodies having particle sizes in a range, for example, from several microns to several mm. Particle bodies having sizes on the order of microns are called fine powder. According to the present invention, however, fine powder and granules are generally referred to as particle bodies.

For example, when only a half face of a particle body comprising glass is coated with titanium or the like, the particle body is increased in brightness by light refracted inside of the glass in addition to light reflected from the coated portion, thus producing an article excellent in decoration properties.

When the sputtering above-mentioned is used for such coating, the following troubles are caused. Because the sputtering speed is low, the target is required to be increased in size or in number in order to improve the film forming ability. Further, the target usage efficiency is low.

When a CVD (chemical vapor deposition) is used, expensive gas can disadvantageously be utilized only on the order of several % in view of film forming efficiency, and it is indispensable to install facilities for collecting a highly reactive gas in order to assure safety. This not only makes the facilities in a large scale, but also increases the installation cost.

On the other hand, according to an ion plating method of prior art, a subject to be coated is disposed above the evaporation source. Accordingly, when the subject to be coated is fine particle bodies, it is very difficult to merely hold, above the evaporation source, a number of particle bodies with their undersides facing the evaporation face.

When it is supposed that the evaporation source is disposed above the subject to be coated, the following troubles are newly caused. At an evaporation face comprising the bottom of the evaporation source, a coating substance is liquefied after heated and molten, and then evaporated. However, the liquefied coating substance is readily converted into drops due to its surface tension. This increases the contact angle of the drop surface of the coating substance with respect to the evaporation face, causing the liquefied coating substance to readily drop on the particle bodies. This disadvantageously prevents a uniform thin film from being formed on the surfaces of the particle bodies.

SUMMARY OF THE INVENTION

It is an object of the present invention to provide a making method of a coated body by using ion plating and a making apparatus of the same, each of which is high in coating speed and is capable of forming a uniform thin film.

To achieve the object above-mentioned, the present invention provides, as a preferred embodiment, a making method of a coated body by using ion plating, comprising: a step of heating a melt and evaporating source housed in an evaporation container disposed above a subject to be coated in a vacuum container; a step of evaporating the melt and evaporating source in the form of evaporated particles through a number of fine evaporation holes formed in an evaporation face formed by the bottom of the evaporation container, yet preventing the melt and evaporating source from dropping down; a step of ionizing the evaporated particles obtained from the melt and evaporating source with the use of plasma generated between the evaporation container and the subject to be coated; and a step of coating, from above, the surface of the subject to be coated with the ionized evaporated-particles, causing the ionized evaporated-particles to adhere to the surface of the subject to be coated, thus forming a coating film thereon.

In the ion plating method of ionizing a substance to form a thin film, the embodiment above-mentioned is arranged such that ions of the thin-film forming material are caused to gravitationally fall such that the ions coat and adhere to, from above, the surface of the subject to be coated. Accordingly, a uniform coating film high in adhering intensity can be formed in a short period of time. Further, the evaporation holes are very fine. This prevents the melt and evaporating source from dropping through the evaporation holes, thus enabling a uniform coating film to be formed.

DESCRIPTION OF THE PREFERRED EMBODIMENTS

The following description will discuss preferred embodiments of the present invention with reference to the attached drawings.

Figure 1:
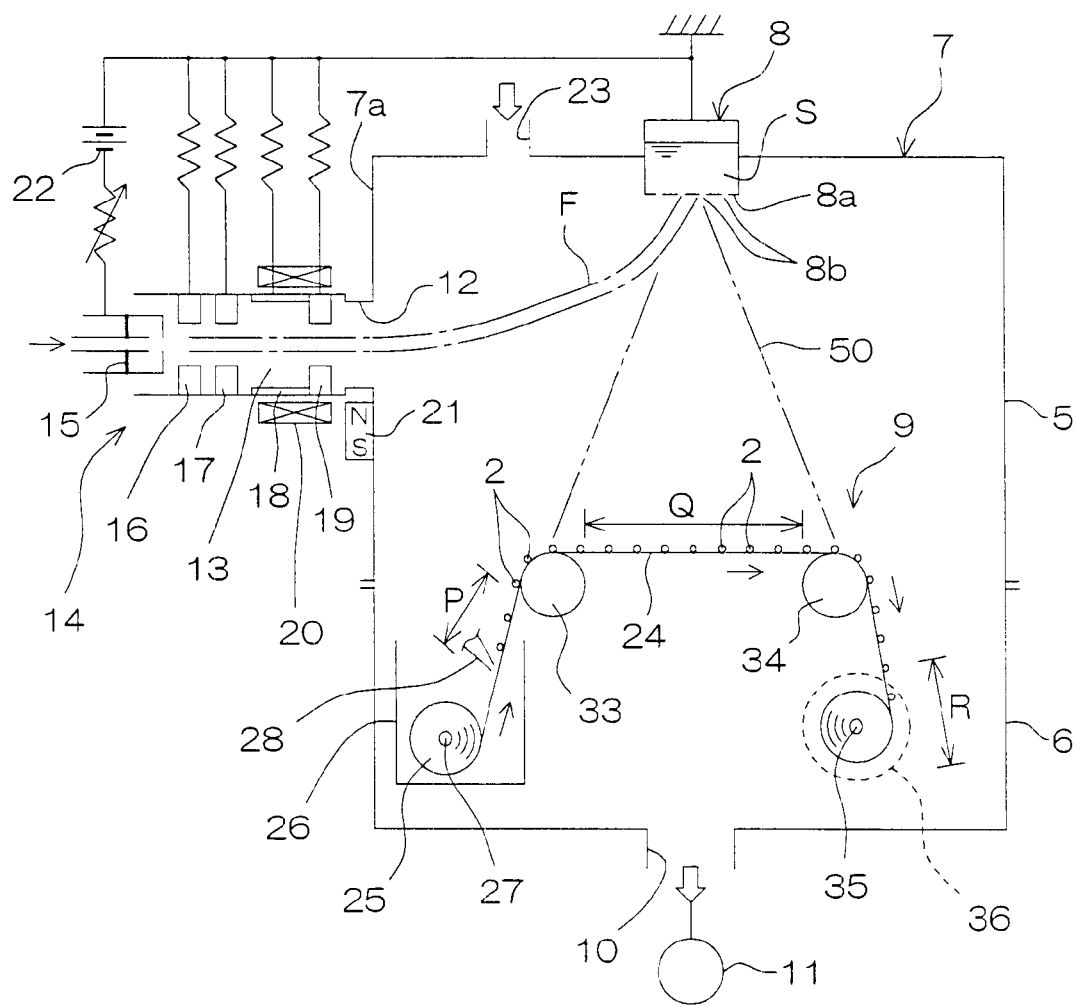
FIG. 1 is a section view schematically illustrating the arrangement of apparatus for producing coated bodies according to a first embodiment of the present invention.
Figure 2:
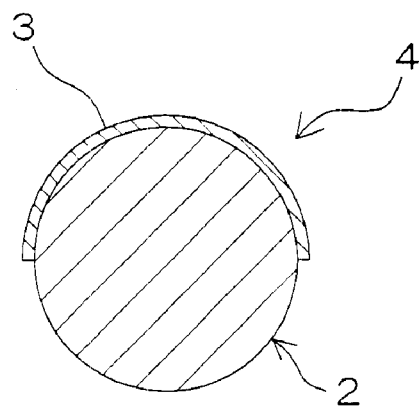
FIG. 2 is a section view of a half-face coated particle body as a coated body.

FIG. 1 is a view schematically illustrating the arrangement of apparatus for producing coated bodies according to a first embodiment of the present invention. A production apparatus 1 is arranged to produce half-face coated particle bodies 4 each having a coating film 3 made of a coating substance substantially on a half face of a particle body 2 as shown in FIG. 2. In the following, the description will be made of production of half-face coated particle bodies as coated bodies. It is a matter of course, however, that the present invention can be applied for production of whole-face coated particle bodies or for production of coated bodies each in the form of a flat plate or the like.

Examples of the material of the particle bodies 2 serving as a subject to be coated include metal, glass, ceramics, mica, carbon and the like. Examples of the coating substance for forming the coating film 3 include metal of every kind such as nickel, gold, silver, copper, indium and the like, as well as general metal such as aluminium, titanium and the like.

Referring to FIG. 1, the production apparatus 1 has a vacuum container 7 which can be divided into, for example, an upper container portion 5 and a lower container portion 6. Disposed in the vacuum container 7 at its upper portion is an evaporation container 8, serving as a target, which houses a melt and evaporating source S comprising a film-forming material in a molten state. Disposed under the evaporation container 8 is a conveyor device 9 for placing and conveying a number of particle bodies 2 as the subject to be coated, to a coating and adhering zone Q under the evaporation container 8. In a falling zone 50, evaporated particles fall down from the evaporation container 8 in a downwardly flaring manner.

Disposed in the bottom of the vacuum container 7 is an exhaust port 10, through which the vacuum container 7 is evacuated by a vacuum pump 11 serving as evacuating means. Preferably, there is used the vacuum pump 11 capable of forming a vacuum of which degree is equivalent to or higher than $1 \times 10^{-4}$ Torr.

Formed in an upper portion of a side face 7a of the vacuum container 7 is a gas inlet port 12 for introducing a carrier gas such as argon, helium, hydrogen or the like. A plasma gun 14 serving as a discharge plasma flow generating device is disposed in a gas introduction passage 13 which is formed by the side of the vacuum container 7 and which communicates with the gas inlet port 12. This plasma gun 14 has a cathode 15, cylindrical first and second intermediate electrodes 16, 17, an auxiliary anode ring 18 and an auxiliary anode ring 19 successively in this order in the carrier gas flowing direction. Preferably, a Ta—LaB$_6$ composite cathode suitable for plasma generation is used as the cathode 15.

There is disposed a hollow electromagnetic coil 20 for converging a discharge plasma flow F which passes through an auxiliary anode zone (the auxiliary anode ring 18 and the auxiliary anode ring 19) in the plasma gun 14. There is disposed a permanent magnet 21 serving as magnetic field means for deflecting, upwardly (toward the evaporation container 8), the plasma flow which has passed through the auxiliary anode ring 19. A discharge power source 22 is disposed for gradually increasing the differences in potential between the cathode 15 and each of the auxiliary anode ring 18, the auxiliary anode ring 19 and the evaporation container 8. Formed in an upper portion of the vacuum container 7 is a reaction gas inlet port 23 for introducing a reaction gas of oxygen, nitrogen, acetylene or the like, which is to be reacted with evaporated particles.

The discharge plasma flow F from the cathode 15 successively passes through the cylindrical first and second intermediate electrodes 16, 17, the auxiliary anode ring 18 and the auxiliary anode ring 19, and is then introduced in the vacuum container 7 through the gas inlet port 12. A ferromagnetic field (e.g., 300~500 gausses) parallel to the plasma flow is applied to that auxiliary anode zone of the plasma gun 14 where the auxiliary anode ring 18 and the auxiliary anode ring 19 are disposed. After magnetron motion in the large number of times and the collision with neutral particles in the large number of times, the electrons can reach the center of the auxiliary anode ring 19 serving as the anode. Double-pressure-gradient type PIG discharging is conducted in this center of the auxiliary anode ring 19. The plasma flow having passed through the auxiliary anode ring 19 strikes against the evaporation container 8 serving as the anode because a suitable magnetic field is present in the vacuum container 7.

DC discharging is conducted with the degree of a vacuum around the cathode 15 held to $1~10^{-1}$ Torr and with the degree of a vacuum around the evaporation container 8 as the anode held to $10^{31\ 4}$ Torr.

The evaporation container 8 is made of a heat resisting material such as molybdenum (Mo), tungsten (W), carbon (C), ceramics or the like, and houses the melt and evaporating source S comprising a molten film-forming material. The bottom of the evaporation container 8 serves as an evaporation face 8a having a number of fine evaporation holes 8b. This means that the melt and evaporating source S in the evaporation container 8 faces the outside thereof through these fine evaporation holes 8b. Each of the fine evaporation holes 8b has such a diameter as to prevent the melt and evaporating source S from falling and as to accelerate the evaporation thereof. More specifically, the diameter of the fine evaporation holes 8b is preferably in the range of about 0.1 mm to about several mm.

The conveyor device 9 conveys a number of particle bodies 2 as the subject to be coated, using an electrostatic sheet 24 as a conveyor belt. The electrostatic sheet 24 is arranged to be reeled out from a roll body 25 in which the electrostatic sheet 24 is being wound in multiple piles. This roll body 25 is housed in a case 26 and rotatably supported by a feeding reel 27. Disposed in the case 26 is a feeding device 28 for feeding particle bodies 2 onto the surface of the electrostatic sheet 24 reeled out from the roll body 25, causing the particle bodies 2 to be electrostatically adsorbed by the surface of the electrostatic sheet 24. It is noted that the feeding device 28 is conceptually shown in FIG. 1.

Figure 3:
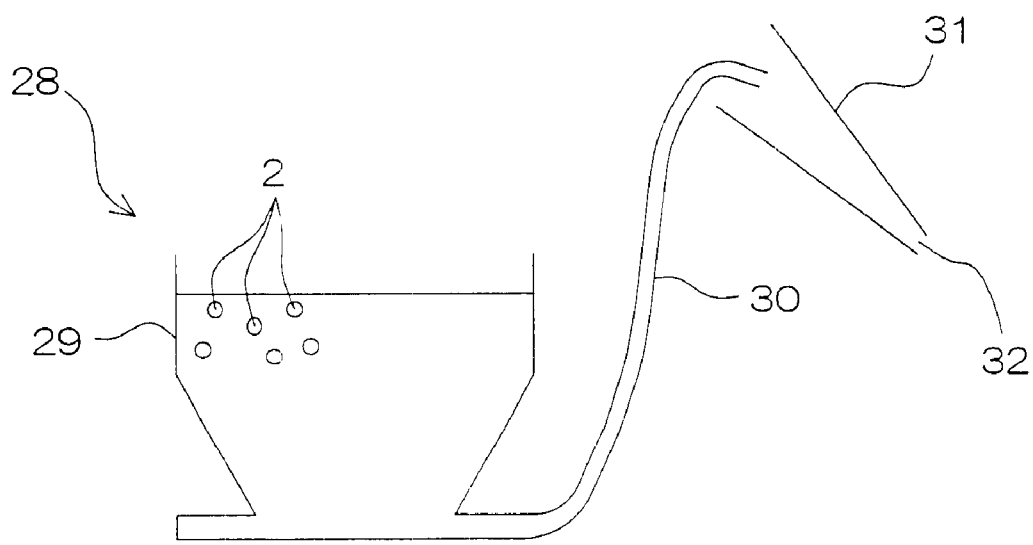
FIG. 3 is a schematic view of a feeding device for feeding particle bodies to an electrostatic sheet serving as a conveyor belt.

As a matter of fact, the feeding device 28 has a hopper 29 which houses a number of particle bodies 2 as shown in FIG. 3. Provision is made such that particle bodies 2 are guided from a lower portion of the hopper 29 to a feeding case 31 through a resilient tube-like screw conveyor 30, and that the particle bodies 2 thus guided are supplied to the surface of the electrostatic sheet 24 through a feeding opening 32 of the feeding case 31.

As an example of the screw conveyor 30, there can be mentioned a conveyor using a coil spring. The feeding case 31 comprises a tapering rectangular case and is arranged to supply, in a falling manner, the particle bodies 2 fed through the screw conveyor 30. The feeding opening 32 is made in the form of a rectangular slit having a width substantially equal to the width of the electrostatic sheet 24 (that is, the feeding opening 32 is long in the widthwise direction). This enable particle bodies 2 to be uniformly distributed and supplied to the electrostatic sheet 24 having a predetermined width.

Referring again to FIG. 1, the electrostatic sheet 24 reeled out from the roll body 25 to the outside of the case 26, is wound by a winding reel 35 through a pair of left and right intermediate reels 33, 34. In FIG. 1, a feeding zone P in the vicinity of the case 26 serves as a zone where particle bodies 2 are supplied to the electrostatic sheet 24, a coating and adhering zone Q serves as a zone where falling evaporated-particles in the falling zone 50 coat and adhere to the particle bodies 2 on the electrostatic sheet 24 installed between the intermediate reels 33, 34, and a collecting zone R serves as a zone where the electrostatic sheet 24 is wound on the winding reel 35, causing the half-face coated particle bodies 4 are collected.

In view of reduction in the cost of production of half-face coated particle bodies as coated bodies, it is preferable to use, as the material of the electrostatic sheet 24, an economical polyethylene film or sheet which is widely used for food wrapping at home.

The winding reel 35 is rotationally driven by a motor 36 as drive means through a rotary shaft (not shown). Preferably, the motor 36 is disposed outside of the vacuum container 7 for the following reasons. Such an arrangement advantageously prevents the vacuum container 7 from being made in a large scale and makes it possible to use a lubricant for the bearing which receives the rotary portion of the motor 36, resulting in improvement in bearing durability. A motor for rotationally driving the coil spring or the like in the screw conveyor 30, is also preferably disposed outside of the vacuum container 7 for reasons similar to those above-mentioned.

When the winding reel 35 is driven, the electrostatic sheet 24 is reeled out from the roll body 25. A number of particle bodies 2 are electrostatically adsorbed by the electrostatic sheet 24 in the case 26. Then, the electrostatic sheet 24 passes through the coating and adhering zone Q where the particle bodies 2 are coated at their half faces. Finally, the electrostatic sheet 24 is wound by the winding reel 35 and the half-face coated particle bodies are collected.

According to the embodiment above-mentioned, the melt and evaporating source S is disposed above a number of particle bodies 2, serving as the subject to be coated, in the coating and adhering zone Q, and ionized evaporated-particles obtained from the melt and evaporating source S are caused to gravitationally fall such that the evaporated particles coat and adhere to particle bodies 2 under the melt and evaporating source S. This enables the film-forming speed to be fast. Further, provision is made to prevent the melt and evaporating source S from dropping on the particle bodies 2 thereunder through a number of fine evaporation holes 8b. This enables a uniform thin film to be formed.

In particular, the plasma gun 14 as a discharge plasma flow generating device is disposed by the side of the vacuum container 7. Therefore, the plasma gun 14 is hardly contaminated. This requires no maintenance for a long period of time, thus improving the production efficiency.

The particle bodies 2 are conveyed as adsorbed by the electrostatic sheet 24 and held in a predetermined posture. It is therefore possible to produce half-face coated particle bodies 4 with coating films securely formed only on those upper half-faces of the particle bodies 2 which face the evaporation face 8a of the evaporation container 8. Further, a number of particle bodies 2 can be treated as continuously conveyed to the coating and adhering zone Q in the vacuum container 7. This remarkably improves the production ability.

Figure 4:
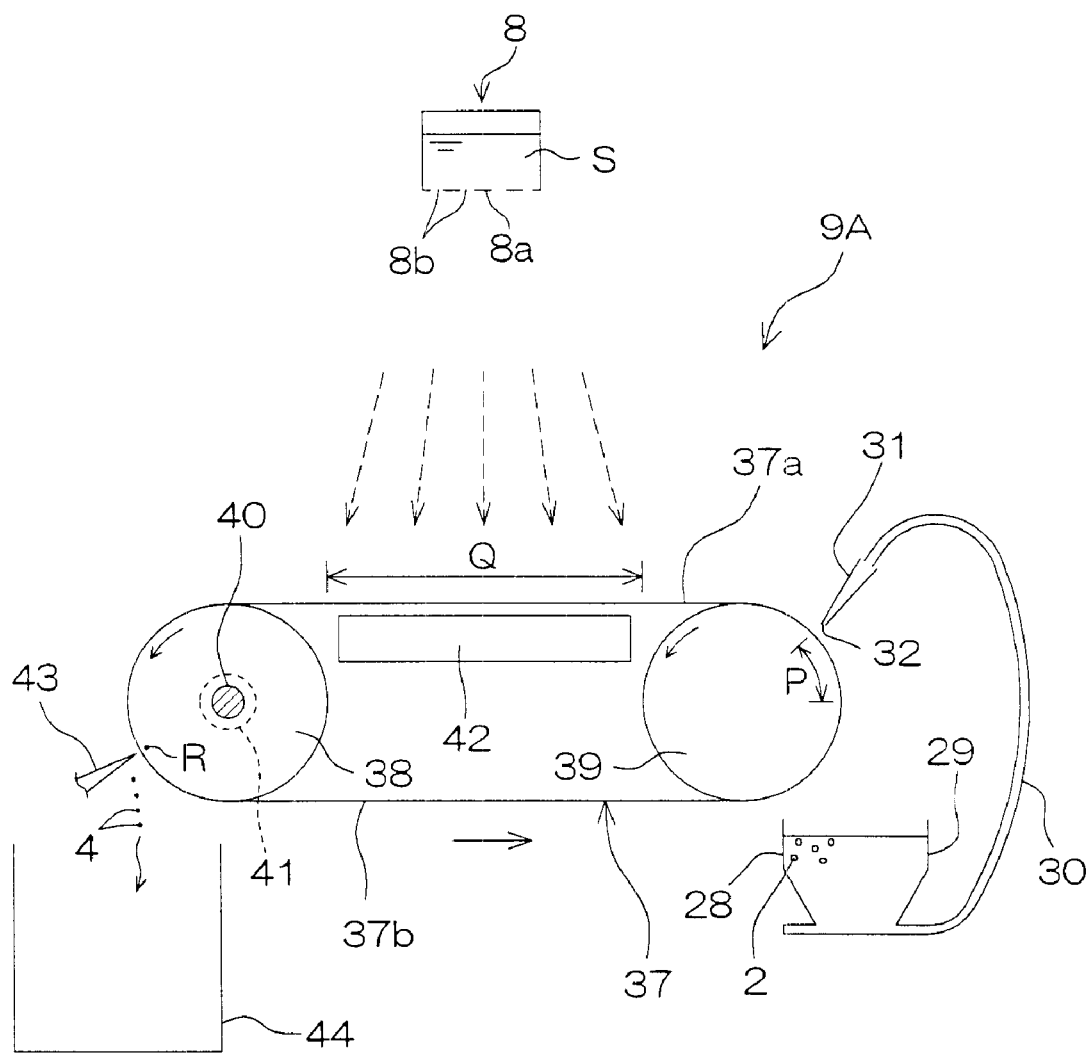
FIG. 4 is a schematic section view of main portions of a coated-body production apparatus according to a second embodiment of the present invention.

FIG. 4 shows a conveyor device of another embodiment of the present invention. Referring to FIG. 4, this embodiment differs from the embodiment in FIG. 1 in that there is disposed a conveyor device 9A which has an endless conveyor belt 37, made of a magnetizable material, arranged to be circulated successively from a feeding zone P, a coating and adhering zone Q and a collecting zone R More specifically, the conveyor belt 37 is wound on and installed between a drive pulley 38 and a follower pulley 39, and a rotary shaft 40 of the drive pulley 38 extends to the outside of the vacuum container 7 through a through-hole formed in the wall thereof, and is connected directly to a motor 41. A sealing member such as an O-ring is disposed in the through-hole such that the vacuum container 7 is hermetically sealed.

The conveyor belt 37 is made of a magnetizable material such as silicone rubber containing a magnetic material such as iron or the like.

The coating and adhering zone Q is formed by that zone of the conveyor belt 37 which faces the evaporation container 8 disposed thereabove. Disposed immediately below this coating and adhering zone Q is a magnetizing member 42 made of a permanent magnet or an electromagnet for magnetizing the conveyor belt 37. The feeding zone P is formed by that zone of the conveyor belt 37 which is wound on the upper inclined portion of the peripheral surface of the follower pulley 39. The feeding zone P corresponds to the starting-end portion of an upper track 37a of the conveyor belt 37. A feeding device 28 similar to that used in the embodiment in FIG. 3 is disposed for supplying particle bodies 2 to the conveyor belt 37 in the feeding zone P. The particle bodies 2 which have not been adsorbed by the conveyor belt 37, naturally fall down and are housed again in a hopper 29 disposed under the feeding zone P.

The collecting zone R corresponds to a portion of the conveyor belt 37 on the lower inclined portion of the peripheral surface of the drive pulley 38 (the starting-end portion of a lower track 37b of the conveyor belt 37). Disposed in the collecting zone R is a spatula-like scraper 43 to be resiliently pressed to the surface of the conveyor belt 37. Disposed under the scraper 43 is a collecting box 44 for receiving the half-face coated particle bodies 4 scraped from the conveyor belt 37 by the scraper 43. The scraper 43 and the collecting box 44 form collecting means.

As the material of the scraper 43, there may be used, for example, Bakelite or other resin. A thin plate of stainless steel may also be used.

The following description will discuss the operation of this production apparatus.

When the conveyor belt 37 is rotationally driven in the vacuum container 7, the conveyor belt 37 successively passes through the feeding zone P, the coating and adhering zone Q and the collecting zone R.

In the feeding zone P, a number of particle bodies 2 are supplied from the feeding case 31 of the feeding device 28. At this time, the particle bodies 2 which have not been held by the conveyor belt 37, fall downward because the conveyor belt 37 in the feeding zone P is upwardly inclined in an arcuate manner. This not only accelerates the particle bodies 2 to be uniformly and evenly placed on the conveyor belt 37, but also prevents the particle bodies 2 from being placed, one over the other, on the conveyor belt 37. The particle bodies 2 which have not been placed on the conveyor belt 37 and dropped, are received and housed again by the hopper 29 disposed thereunder.

The particle bodies 2 uniformly supplied onto the conveyor belt 37 in the manner above-mentioned, are then conveyed to the coating and adhering zone Q. Because the conveyor belt 37 is magnetized by the magnetizing member 42, the particle bodies on the conveyor belt 37 are magnetically adsorbed by the conveyor belt 37 and securely held in a predetermined posture. As held in a predetermined posture, the particle bodies 2 receive plasma vapor from above and are coated only at their upper half-faces with a coating substance. Thus, the particle bodies 2 are converted into half-face coated particle bodies 4.

Then, the half-face coated particle bodies 4 are scraped from the conveyor belt 37 by the scraper 43 in the collecting zone R, and fall in and are collected by the collecting box 44. The magnetism of the conveyor belt 37 is released after the conveyor belt 37 has passed through the coating and adhering zone Q and has been separated from the magnetizing member 42. Accordingly, the half-face coated particle bodies 4 can securely and readily be scraped from the conveyor belt 37 by the scraper 43. Since the magnetism of the conveyor belt 37 is being released in the collecting zone R, it is possible to arrange such that without use of the scraper 43, the half-face coated particle bodies 4 are caused to naturally fall by gravity from the downwardly inclined portion of the conveyor belt 37 along the peripheral surface of the drive pulley 38, and are collected in the collecting box 44. However, the use of the scraper 43 can more securely scrape the half-face coated particle bodies 4 from the conveyor belt 37.

As discussed in the foregoing, the half-face coated particle bodies 4 can continuously be produced by continuously supplying particle bodies 2, to the coating and adhering zone Q, as held in a predetermined posture with respect to the evaporation face 8a of the evaporation container 8. Thus, the half-face coated particle bodies 4 can be mass-produced with a low cost.

In the embodiment in FIG. 4, the magnetizable conveyor belt 37 is used. However, there may be used a conveyor belt which can be electrically charged, and provision may be made such that this conveyor belt is electrically charged by charging means and the static electricity is eliminated therefrom by static eliminating means, thus giving and removing the adsorptivity to and from the conveyor belt.

According to the present invention, the shape of each of particle bodies as the subject to be coated should not be limited to a sphere, but may be an ellipsoid, a rectangular parallelepiped or an irregular shape.

What we claim is:

1. An apparatus for coating a body using ion plating, comprising:
    a vacuum container for housing a subject to be coated;
    means for placing, inside of said vacuum container, said subject to be coated;
    an evaporation container which is disposed above said subject to be coated, said evaporation container housing a melt and evaporating source and having an evaporation face comprising at least the bottom of said evaporation container, said evaporation face having a plurality of fine evaporation holes formed therein;
    means for heating said melt and evaporating source; and
    means for generating plasma between said evaporation container and said subject to be coated;
    wherein said melt and evaporating source is heated by said heating means such that said melt and evaporating source is evaporated through said plurality of fine evaporation holes, said evaporation face preventing said melt and evaporating source from falling,
    wherein evaporated particles from said melt and evaporating source are ionized with use of said plasma,
    wherein said ionized evaporated particles coat and adhere to, from above, a surface of said subject to be coated, thus forming a coating film thereon,
    wherein said subject to be coated comprises a plurality of particle bodies, and
    wherein said placing means comprises a conveyor belt capable of adsorbing said plurality of particle bodies.

2. An apparatus according to claim 1, further comprising evacuating means for evacuating said vacuum container.

3. An apparatus according to claim 1, further comprising discharge plasma flow generating means for supplying a discharge plasma flow to the inside of said vacuum container with a carrier gas introduced from a side of said vacuum container.

4. An apparatus according to claim 3, further comprising magnetizing means for deflecting, upwardly toward said evaporation face, said discharge plasma flow.

5. An apparatus according to claim 1, further comprising means for driving said conveyor belt such that said conveyor belt successively passes through a feeding zone where said particle bodies are supplied by feeding means, a coating and adhering zone where said ionized evaporated particles coat and adhere to said particle bodies, and a collecting zone where said particle bodies are collected after coating.

6. An apparatus according to claim 5, wherein said feeding means is disposed in said vacuum container.

7. An apparatus according to claim 6, wherein said feeding means has a hopper for housing said plurality of particle bodies and a feeding case for supplying said particle bodies conveyed from said hopper to said conveyor belt.

8. An apparatus according to claim 7, wherein said feeding case has an opening for supplying said particle bodies to said conveyor belt in a falling manner, and the opening is made in the form of a rectangular slit having a width substantially equal to the width of said conveyor belt.

9. An apparatus according to claim 5, wherein said conveyor belt contains a magnetizable material and has a means for magnetizing said conveyor belt in an adhering zone.

10. An apparatus according to claim 5, wherein said conveyor belt is reeled out from a feeding reel and wound up by a winding reel, and said conveyor belt is wound by said winding reel in a state of adsorbing the coated particle bodies, thereby collecting said particle bodies in the collecting zone.

11. An apparatus according to claim 5, further comprising:
    a scraper for scraping said particle bodies from said conveyor belt, said scraper being pressed resiliently to the surface of said conveyor belt in said collecting zone; and
    a collecting container for receiving said coated particle bodies scraped by said scraper.

12. An apparatus according to claim 1, wherein said conveyor belt includes an electrostatic sheet capable of adsorbing said particle bodies.

13. An apparatus according to claim 1, wherein said conveyor belt includes an electrostatic sheet of polyethylene resin.

14. An apparatus according to claim 1, wherein said conveyor belt includes a magnetizable material.

15. An apparatus according to claim 1, wherein said conveyor belt includes a rubber containing a magnetic material.

16. An apparatus according to claim 1, wherein said conveyor belt includes a silicon rubber containing a magnetic material.

17. An apparatus according to claim 1, wherein said conveyor belt comprises an endless belt.

18. An apparatus according to claim 1, wherein said conveyor belt is reeled out from a feeding reel and wound up by a winding reel.

* * * * *